United States Patent [19]

Prins

[11] Patent Number: 6,140,148
[45] Date of Patent: Oct. 31, 2000

[54] METHOD OF MAKING A CONTACT TO A DIAMOND

[76] Inventor: Johan Frans Prins, 8 Portland Pl., Northcliff, 2115, South Africa

[21] Appl. No.: 09/147,368
[22] PCT Filed: Jun. 10, 1997
[86] PCT No.: PCT/GB97/01558
§ 371 Date: Feb. 25, 1999
§ 102(e) Date: Feb. 25, 1999
[87] PCT Pub. No.: WO97/48128
PCT Pub. Date: Dec. 18, 1997

[30] Foreign Application Priority Data

Jun. 10, 1996 [ZA] South Africa .......................... 96/4921.

[51] Int. Cl.[7] ................................................. H01L 21/00
[52] U.S. Cl. ........................... 438/105; 438/931; 257/77; 257/22
[58] Field of Search .................... 438/105, 931; 257/77, 22; 427/523, 38, 526, 140, 530, 533

[56] References Cited

U.S. PATENT DOCUMENTS

| 4,894,255 | 1/1990 | Page et al. ................................. 427/38 |
| 5,382,809 | 1/1995 | Nishibayashi et al. .................... 257/77 |
| 5,609,926 | 3/1997 | Prins ........................................ 427/523 |

FOREIGN PATENT DOCUMENTS 0 413 435    2/1991   European Pat. Off. .

OTHER PUBLICATIONS

J.F. Prins, Diamond and Related Materials, vol. 4, Nos. 5/6, pp. 580–585, "Ion–Implanted n–Type Diamond: Electrical Evidence", May 1, 1995.

J.F. Prins, Journal of Physics D: Applied Physics, vol. 22, No. 10, pp. 1562–1564, "Preparation of Ohmic Contacts to Semiconducting Diamond", Oct. 14, 1989.

Primary Examiner—Donald L. Monin, Jr.
Assistant Examiner—Hoai Pham
Attorney, Agent, or Firm—Oblon, Spivak, McClelland, Maier & Neustadt, P.C.

[57] ABSTRACT

The invention provides a method of making an ohmic contact to a n-type diamond or an injecting contact to a p-type diamond. The method includes the steps of implanting a surface of the diamond with a n-type dopant atom at a dose just below the amorphisation threshold of the diamond to create an implanted region below the surface and extending from the surface, annealing the implanted region to allow tunnelling of electrons into the diamond in the case of a n-type diamond and allow electrons to be injected into the diamond in the case of a p-type diamond, and metallising at least a portion of the surface through which implantation occurred.

11 Claims, 2 Drawing Sheets

METHOD OF MAKING A CONTACT TO A DIAMOND

BACKGROUND OF THE INVENTION

This invention relates to a method of making ohmic contacts to n-type diamond and injecting contacts to p-type diamond.

n-Type diamond can be prepared by suitable implantation-annealing sequences of the required donor atoms, for example phosphorus. This causes a massive movement in the position of the Fermi level towards the conduction band, which, in turn, makes it difficult to effect ohmic contacts to such a layer.

In the case of p-type diamond containing boron acceptors, many different methods have been devised to prepare ohmic contacts. Contacts with low resistance can be prepared by first overdoping a thin layer at the surface of the contact with boron acceptors. Such a layer allows the current or charge carriers to tunnel into the diamond thus eliminating any unwanted rectifying behaviour. A popular way to achieve the latter is to implant the surface with boron ions (typically at energies varying from 30 to 60 keV) and to a very high dose (typically larger than $1 \times 10^{16}$ ions cm$^{-2}$) while maintaining the diamond at temperatures between room temperature and approximately 300° C. At these high ion doses, the implanted surface layer becomes amorphous. After a subsequent anneal, typically at temperatures ranging from 600 to 1400° C., the layer becomes graphitic and can be etched off by using a suitable oxidising acid solution. After etching the remaining surface then contains a very high density of boron acceptors, which facilitates the preparation of ohmic contacts.

This method does not work for larger atoms like phosphorus. After following the same procedure, the etched surface does not contain a large density of phosphorus atoms. Although it is possible to dope the diamond n-type, it is more difficult to prepare an overdoped surface. It is known that highly damaged diamond, prepared, for example, by implanting carbon ions to a high does under similar conditions as the boron-ions mentioned above can act like n-type diamond by creating a p-n junction when prepared on a p-type semiconducting diamond. One would thus expect that a similar treatment of n-type diamond may lead to ohmic contacts. However, this was found not to be the case.

SUMMARY OF THE INVENTION

According to the present invention, a method of making an ohmic contact to an n-type diamond or an injecting contact to a p-type diamond includes the steps of:

(i) implanting a surface of the diamond with an n-type dopant atom at a dose just below the amorphisation threshold of the diamond to create an implanted region below the surface and extending from the surface;

(ii) annealing the implanted region to allow tunnelling of electrons into the diamond in the case of an n-type diamond, and allow electrons to be injected into the diamond in the case of a p-type diamond; and (iii) metallising at least a portion of the surface through which implantation occurred.

DESCRIPTION OF EMBODIMENTS

Figure 1:
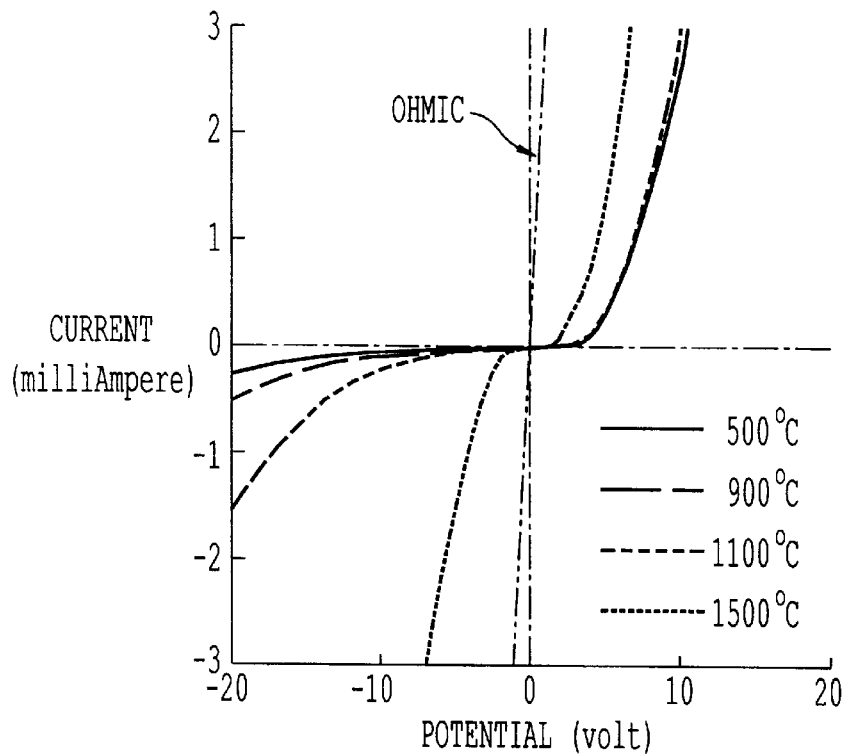
FIGS. 1 to 4 illustrate graphically data obtained in various experiments carried out on p-type and n-type diamond.

When implanting diamond with any ion at temperatures below about 500° C., there exists an upper dose threshold beyond which the implanted layer becomes amorphous, such that when the layer is annealed, this implanted layer is converted into graphite. This threshold dose depends on the ion being implanted (the larger the ion, the lower this dose) and the temperature of the diamond. At higher temperatures some self-annealing can occur which increases this threshold dose. Just below this threshold, the damage is very large and although annealing does not lead to graphite, it causes new substructures to form which may be equated to a partial or total phase change of the diamond material. It has been suggested that these phases may be a so-called amorphous diamond which maintains an sp$^3$ bonded network structure as is found in diamond-like carbon films. Thus, in step (ii) of the method of the invention, a change in physical characteristics occurs in the implanted region such as to produce this type of structure. It is this structure combined with the dopant atoms, generally in high density, in it, which allows electrons to tunnel into the diamond for an n-type diamond and to be injected into the diamond for a p-type diamond.

As pointed out above, the threshold dose which renders an implanted layer of diamond amorphous will depend on the ion being implanted and the temperature of the diamond. This can readily be determined experimentally for any particular ion. For example, a diamond may be implanted through a surface using an ion which varies in its energy. The higher the energy the deeper the implantation. The dose can also be varied with a low dose being used for the high energy implantation and a progressively higher dose being used for the lower energy implantation. This creates a damaged layer or region within the diamond, the damage being relatively low at the deep end of the layer and relatively high at the shallow or surface end of the layer. Indeed, the dose will be selected such that amorphisation of the diamond occurs in the surface and to a limited depth. On annealing, the amorphous layer will be converted to graphite and this may be removed using known oxidising etches. An example of such an etch is a strong inorganic acid such as a solution of sulphuric, nitric and perchloric acids. The layer which remains immediately below the layer removed by the oxidising etch is a damaged layer created by a dose just below the amorphisation threshold. It is this layer which, on annealing, has the characteristics which allow charge carriers to tunnel into the diamond in the case of an n-type diamond and to be injected into the diamond in the case of p-type diamond.

The surface of the implanted region may then be metallised by any one of a variety of conducting metals or alloys such as silver, copper, titanium, molybdenum, nickel or the like.

The annealing conditions must be such as to produce in the implanted region or layer the necessary and required characteristics. Generally, the annealing will take place at a temperature of 500° C. or higher. The annealing conditions may be those known in the art such as described, for example, in European Patent Publication No. 0 573 312. The annealing will preferably be rapid in the sense that the annealing temperature is reached in a short space of time. How rapid the annealing temperature is reached would be dependent on factors such as the annealing temperature selected and the thickness of the damaged region. Preferably, the annealing is such that at the temperature selected, the temperature will be reached before the average time it takes for a self-interstitial to move out of the damaged layer. Generally, the annealing temperature will be reached in less than 20 seconds, and typically less than 1 second. The annealing temperature, once reached, will generally be maintained for a period not exceeding 30 minutes.

The dopant atoms which may be used to create n-type characteristics in a material like diamond are well known in the art. Those atoms which lie to the right of carbon in the Periodic Table, such as phosphorus, arsenic, antimony, oxygen, fluorine and nitrogen may be selected to produce suitable n-type characteristics.

The implantation of dopant atoms in step (i) is preferably carried out at a temperature below 500° C., and more particularly at a temperature below 0° C. Temperatures as low as that of liquid nitrogen or lower can conveniently be used as described in EP-B-209 257.

In an example of the invention, an n-type phosphorus-doped diamond layer was implanted with phosphorus ions of energy 30 keV to a dose of $6 \times 10^{14}$ cm$^{-2}$ and at a temperature of 100° C. This dose is just below the amorphisation threshold dose of about $7 \times 10^{14}$ cm$^{-2}$ for phosphorus ions at the implantation temperature used. On subsequent annealing at a temperature of 600° C., the implanted region did not graphitise, but created an intermediate phase of the type described above. The diamond was then cleaned by boiling in an oxidising acid solution such as a solution of sulphuric, hydrochloric or nitric acid, and a portion of the surface through which the implantation occurred covered with silver paint followed by baking in a furnace of 350° C. for more than 3 hours. The metallised portion showed ohmic behaviour.

When following the same procedure as described above on a p-type diamond, an n-p junction was created which injects electrons into the p-type substrate when biased in the forward direction, i.e. the contact is negative and the underlying diamond is positive.

In a further example, a natural type 11 b (p-type, boron doped) diamond of thickness 1,4 mm was provided. Opposite surface areas, each of 8×3,6 mm$^2$, were first rendered ohmic by high-dose boron-ion (B$^+$) implantation at 100° C., followed by annealing at 1200° C. and etching to remove the graphitized surface layers. The surfaces remaining after etching were then covered with silver paint and the linear current-voltage (1-V) characteristics measured. This is shown in FIG. 1 by the ohmic curve. After this measurement, one of the surfaces was repolished in order to remove the overdoped boron layer and, accordingly, the ohmicity of this surface. This surface was then implanted with phosphorus (P$^+$) ions using a series of energies and ion doses (column A) given in Table 1.

TABLE 1

| Energy (keV) | Column A Dose (cm$^{-2}$) | Column B Dose (cm$^{-2}$) |
|---|---|---|
| 170 | $5,0 \times 10^{13}$ | $1,0 \times 10^{13}$ |
| 145 | $1,0 \times 10^{14}$ | $1,0 \times 10^{13}$ |
| 120 | $2,0 \times 10^{14}$ | $1,0 \times 10^{13}$ |
| 95 | $4,0 \times 10^{14}$ | $5,0 \times 10^{13}$ |
| 70 | $6,0 \times 10^{14}$ | $5,0 \times 10^{13}$ |
| 45 | $8,0 \times 10^{14}$ | $1,0 \times 10^{15}$ |
| 30 | $1,0 \times 10^{15}$ | $1,7 \times 10^{15}$ |

Figure 2:
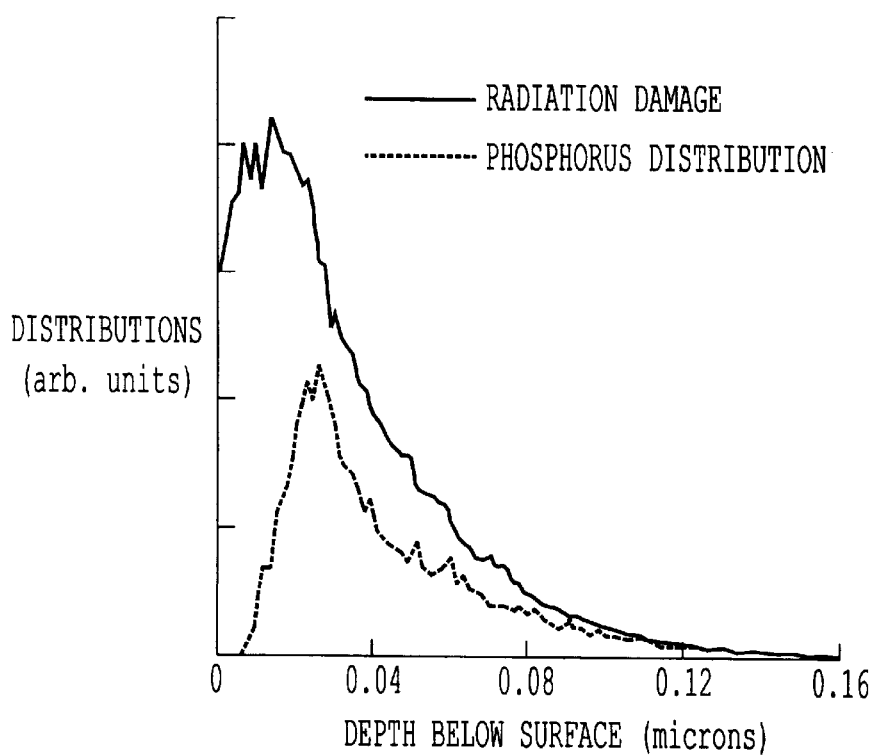

As can be seen, the lowest ion dose was used for the highest energy and the highest for the lowest energy. According to the Monte Carlo Range and Damage Computer Programme TRIM, the distributions of the radiation damage and phosphorus (for column A doses), are as shown in FIG. 2, i.e. both increase from a low value at the end of the implantation depth to a high value at the surface. The doses were chosen in such a way that at the deepest point the radiation damage was well below the threshold of amorphisation while, at the surface, the damage was well above this threshold. Thus, between the deepest point and the surface there was a region which is just below this threshold and which, on annealing, formed the required implantation structure. At depths less than the position of this layer, the damage is high enough to form graphite, and this can then be etched off to expose the required layer needed for the formation of an electron-injecting contact into the p-type diamond.

After suitable etching and annealing, the injecting contact, as well as the ohmic contact at the opposite surface, were covered by silver paint, and the 1-V characteristics determined. The results after a series of isochronal anneals are also shown in FIG. 1, see the 500° C. curve where the diode characteristics can clearly be seen. Switching in the forward direction starts at about 5 volt, as expected for an n-p junction in diamond (which has a bandgap of about 5,4 eV). Some leakage in the reverse direction can be seen which increases with high temperature anneals. In contrast, the forward switching stays unchanged, within experimental error, up to an annealing temperature of 1500° C. An increase in reverse leakage current can be ascribed to tunnelling of carriers across the p-n junction. This is facilitated by a high density of dopants near the junction, and, in this specific case, by the thickness of the n-type injecting layer. After each anneal, the diamond was cleaned by etching in a suitable acid solution. Any graphitic material that formed was thus removed. It is possible that the layer nearer to the surface, which had been damaged to a higher level, turned graphitic at the higher annealing temperatures, and after etching, left behind a thinner n-type injecting region.

Figure 3:
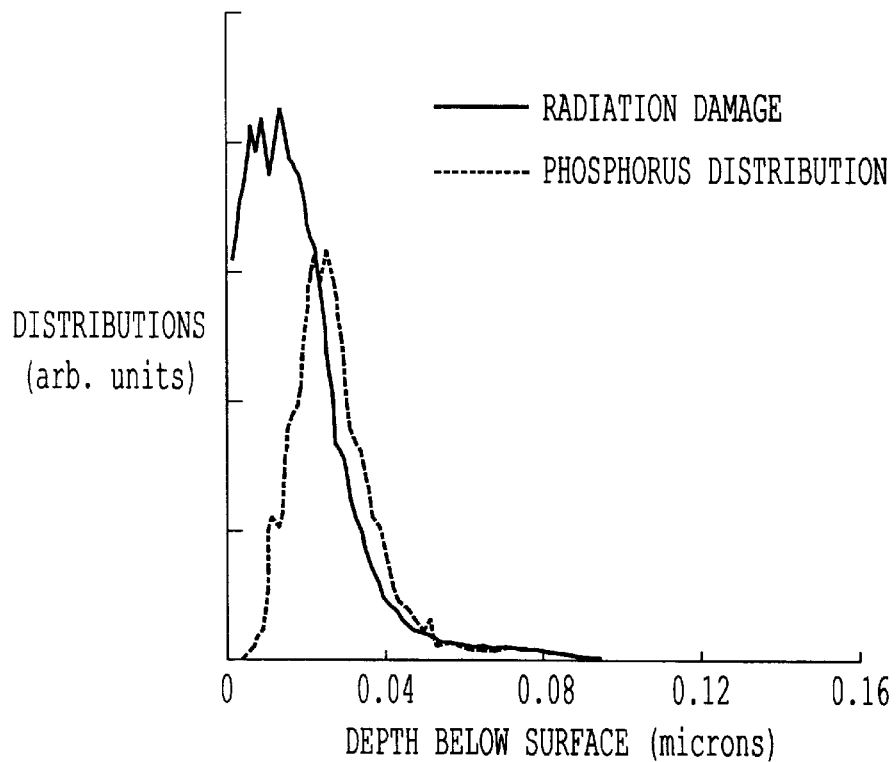
Figure 4:
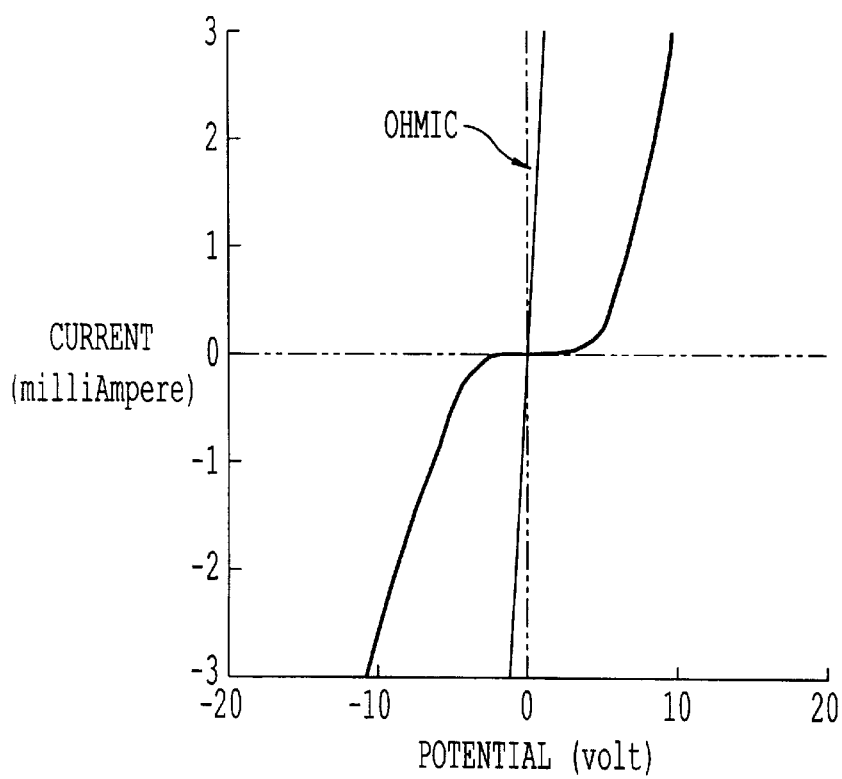

In another experiment, the P$^+$ ion doses were chosen (see column B in Table 1) to generate the phosphorus and damage distributions shown graphically in FIG. 3. Comparing these distributions with those in FIG. 2 (the same y scales are being used) it is clear that the rise in damage, from low to high, occurs over a much smaller depth interval in the latter case. In other words, the n-type injecting layer which forms is much shallower. Furthermore, in the region where this layer forms, the phosphorus concentration is much higher. Accordingly, the intermediate n-type injection layer is much thinner and contains a much higher concentration of phosphorus dopant atoms, than in the other example described above. The I-V characteristics, after annealing to 500° C., of such an injection contact formed on the same type 11 b diamond used before (after polishing off the previous injecting contact) are shown in FIG. 4. Although the forward characteristics are, within experimental error, the same as before, the reverse leakage current is already substantial. By a suitable choice of the implantation parameters, one can change the amount of leakage current from a very low to a very high value.

What is claimed is:

1. A method of making an ohmic contact to an n-type diamond or an injecting contact to a p-type diamond comprising the steps of:
   (i) implanting a surface of the diamond with an n-type dopant atom at a dose just below the amorphisation threshold of the diamond to create an implanted region below the surface and extending from the surface;
   (ii) annealing the implanted region to allow tunneling of electrons into the diamond in the case of an n-type diamond, and allow electrons to be injected into the diamond in the case of a p-type diamond; and
   (iii) metallising at least a portion of the surface through which implantation occurred;

wherein the surface of the diamond is implanted in step (i) with an n-type dopant atom at doses progressively varying from a lower dose for high energy implantation, said lower dose being below the amorphisation threshold of the diamond, to a higher dose for a low energy implantation, said higher dose being above the amorphisation threshold of the diamond, whereby removal of the amorphisized material thus produced after annealing in step (ii), leaves a layer which has received a dose in step (i) just below the amorphisation threshold.

2. A method according to claim 1 wherein the diamond is an n-type diamond.

3. A method according to claim 1 wherein the diamond is a p-type diamond.

4. A method according to claim 1 wherein the dopant atom is selected from phosphorus, arsenic, antimony, oxygen, fluorine and nitrogen.

5. A method according to claim 1 wherein the implantation in step (i) is carried out at a temperature below 500° C.

6. A method according to claim 5 wherein the temperature is that of liquid nitrogen or lower.

7. A method according to claim 1 wherein the implanted region is annealed at a temperature of at least 500° C.

8. A method according to claim 1 wherein the annealing temperature is reached in less than 20 seconds.

9. A method according to claim 1 wherein the annealing temperature, once reached, is maintained for a period not exceeding 30 minutes.

10. A method according to claim 1 wherein the metal used for metallising in step (iii) is selected from silver, copper, titanium, molybdenum and nickel.

11. A diamond having a contact made according to the method of claim 1.

* * * * *